(12) United States Patent
Shih (10) Patent No.: US 8,947,133 B2
(45) Date of Patent: Feb. 3, 2015

(54) SYSTEMS AND METHODS FOR MULTI-LEVEL TERMINATION CALIBRATION FOR VOLTAGE MODE DRIVERS

(71) Applicant: Taiwan Semiconductor Manufacturing Co., Ltd., Hsin-Chu (TW)

(72) Inventor: Yu-Nan Shih, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/758,443

(22) Filed: Feb. 4, 2013

(65) Prior Publication Data

US 2014/0218072 A1    Aug. 7, 2014

(51) Int. Cl.
*H03K 3/00* (2006.01)
*H03K 5/153* (2006.01)

(52) U.S. Cl.
CPC .................... *H03K 5/153* (2013.01)
USPC ........... 327/112; 327/108; 327/170; 327/309; 326/82

(58) Field of Classification Search
CPC ... H03K 17/04; H03K 17/0412; H03K 17/08; H03K 17/133; H03K 17/13; H03K 17/162; H03K 19/0005; H03K 19/00315; H03K 19/00361
USPC ......... 327/108–112, 170, 309; 326/82, 83, 30
See application file for complete search history.

(56) References Cited

U.S. PATENT DOCUMENTS

| | | | |
|---|---|---|---|
| 6,704,818 B1 | 3/2004 | Martin et al. | |
| 7,423,454 B2 * | 9/2008 | Stojanovic et al. | 326/83 |
| 7,486,112 B2 * | 2/2009 | Tanaka | 326/83 |
| 7,489,159 B2 * | 2/2009 | Kim | 326/30 |
| 7,551,897 B1 * | 6/2009 | Savoj | 455/43 |
| 7,714,615 B2 | 5/2010 | Liang et al. | |

OTHER PUBLICATIONS

Wong, et al. "A 27-mW 3.6-Gb/s I/O Transceiver." IEEE Journal of Solid-State Circuits, vol. 39, No. 4, Apr. 2004.
Kossel, et al. "A T-Coil-Enhanced 8.5 Gb/s High-Swing SST Transmitter in 65 nm Bulk CMOS With <- 16 dB Return Loss Over 10 GHz Bandwidth." IEEE Journal of Solid-State Circuits, vol. 43, No. 12, Dec. 2008.

* cited by examiner

*Primary Examiner* — Lincoln Donovan
*Assistant Examiner* — Thomas Skibinski
(74) *Attorney, Agent, or Firm* — Eschweiler & Associates, LLC (57) ABSTRACT

A voltage mode driver system includes a plurality of VMD cells, a plurality of auxiliary cells, a control logic and an output node. The plurality of VMD cells are configured to generate a first output. The plurality of VMD cells are configured to generate a calibrated effective resistance at different signal levels according to a calibration signal. The plurality of auxiliary cells are configured to generate a second output. The output node combines the first output and the second output into a driver output. The control logic is configured to control the plurality of auxiliary cells and the second output according to a selected level. The plurality of VMD cells may be configured to generate a calibrated effective resistance at different signal levels according to a calibration signal. A calibration component is configured to determine a voltage dependence effect and to generate a calibration signal according to the determined voltage dependence effect.

20 Claims, 11 Drawing Sheets

| ORIG CELLS | AUX CELLS | DESCRIPTION |
|---|---|---|
| ON | OFF | FULL SWING LEVEL |
| ON | ON | DE-EMPHASIS LEVEL |

SYSTEMS AND METHODS FOR MULTI-LEVEL TERMINATION CALIBRATION FOR VOLTAGE MODE DRIVERS

BACKGROUND

Voltage mode drivers are a type of driver often used in communication systems. Voltage mode drivers can be utilized to perform types of signalling schemes, such as voltage mode signalling schemes. Additionally, voltage mode drivers can be utilized to implement emphasis techniques, also referred to as pre-emphasis and de-emphasis. De-emphasis is a technique that facilitates communication reliability for distorted signals that pass a channel.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Voltage mode drivers (VMD) are a circuit often utilized in communication systems and the like. Voltage mode drivers can be utilized for generating full swing levels and emphasis levels. The VMDs set emphasis levels, including de-emphasis levels, for communication systems.

Voltage mode drivers typically include a plurality of cells and a calibration component. The calibration component measures and adjusts the output of the plurality of cells to generate a suitable output signal.

Voltage mode drivers can suffer from process variations and the like, which yield output levels that are unacceptable or outside of acceptable ranges for levels, such as de-emphasis levels and full swing levels. The variations can lead to varied termination resistance at varied levels. Additionally, the termination resistance can worsen return loss and result in signal reflection. Conventional mechanisms provide calibration at only full swing levels.

Systems and methods are disclosed that provide multi-level calibration, and include calibration at full swing and de-emphasis levels. The systems and methods include utilizing auxiliary cells to modify emphasis levels to proper levels. The auxiliary cells facilitate compensation for varied termination resistance for non-full swing levels.

Figure 1:
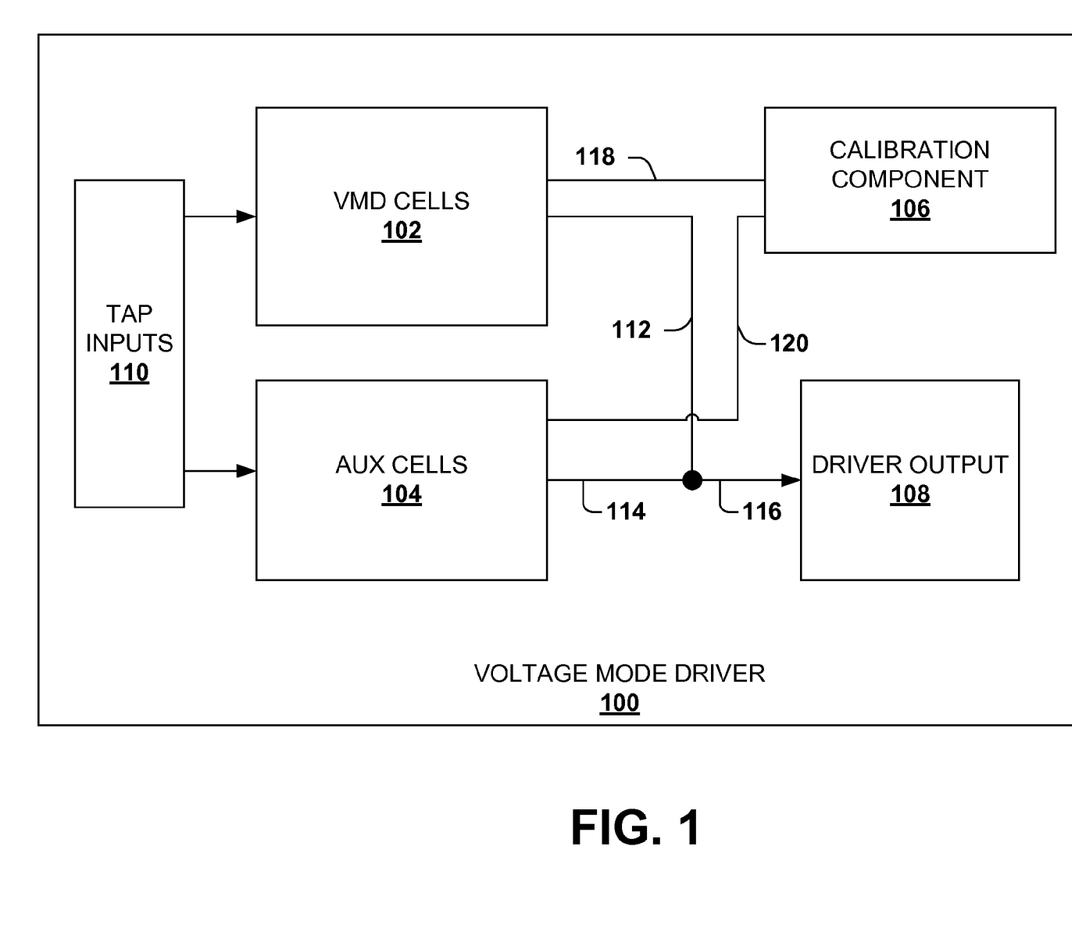
FIG. 1 is a block diagram showing an example voltage mode driver system using auxiliary cells.

FIG. 1 is a block diagram showing an example voltage mode driver system 100 using auxiliary cells. The system 100 compensates for varied termination resistances at different levels by using auxiliary cells. The system 100 is described in a simplified format to aid understanding. Additional details are provided in subsequent figures and discussions.

The system 100 includes voltage mode driver (VMD) cells 102, auxiliary cells 104, a calibration component 106, a driver output 108, and tap inputs 110. The tap inputs 110 are configured to receive suitable inputs for the system 100. Some examples of suitable inputs include tap inputs: a main tap input, a pre-cursor tap input, and a post-cursor tap input. Additionally, the inputs 110 are also configured to receive polarity inputs that change the polarity of other inputs. The polarity inputs can include, for example, a main tap polarity input, a pre-cursor tap input, and a post cursor tap input.

The VMD cells 102 generate a collective output signal 112, which is provided to the driver output 108. The collective output signal 112 is a combination of output signals from all of the individual cells. Each of the individual VMD cells is configured to generate an output according to a tap input and a polarity input.

The VMD cells 102 generally include an upper or pull up transistor and a lower or pull down transistor. The pull up transistor is a PMOS transistor and the pull down transistor is an NMOS transistor. The pull up transistors can comprise multiple transistors connected in parallel. The pull up transistor is serially connected to the pull down transistor. An input/output structure is connected there between to receive cell inputs and provide the individual cell output.

The auxiliary cells 104 are similar to the VMD cells 102. The cells 104 each include a pull up and a pull down transistor. The auxiliary cells 104 are typically controlled by a combinational logic or another suitable mechanism. The auxiliary cells 104 generate an auxiliary cell signal 114 as a collective signal from each of the auxiliary cells 104. The auxiliary cell signal 114 is based on the tap inputs 110 and the control logic or other mechanism.

The collective output 112 and the auxiliary cell signal 114 are combined into a combined cell signal 116 and provided to the driver output 108. The signals 112 and 114 can be combined using a suitable mechanism. The combined cell signal 116 is modulated by selecting or adjusting one or more of the inputs 110.

The calibration component 106 generates calibration code utilized to calibrate termination resistance for the VMD cells 102 and the auxiliary cells 104. The calibration code includes VMD calibration code 118 and auxiliary calibration code 120. The VMD calibration code 118 generally adjusts the termination resistance for the VMD cells such that a total resistance for the cells 102 is at about a selected termination resistance. The adjustment generally accounts for variations at full swing levels.

The auxiliary calibration code 120 generally adjusts the termination resistance for the auxiliary cells 104 such that a total resistance for the cells 104 is at about a selected auxiliary termination resistance. The adjustment for the auxiliary cells 104 typically accounts for variations at de-emphasis levels.

Figure 2:
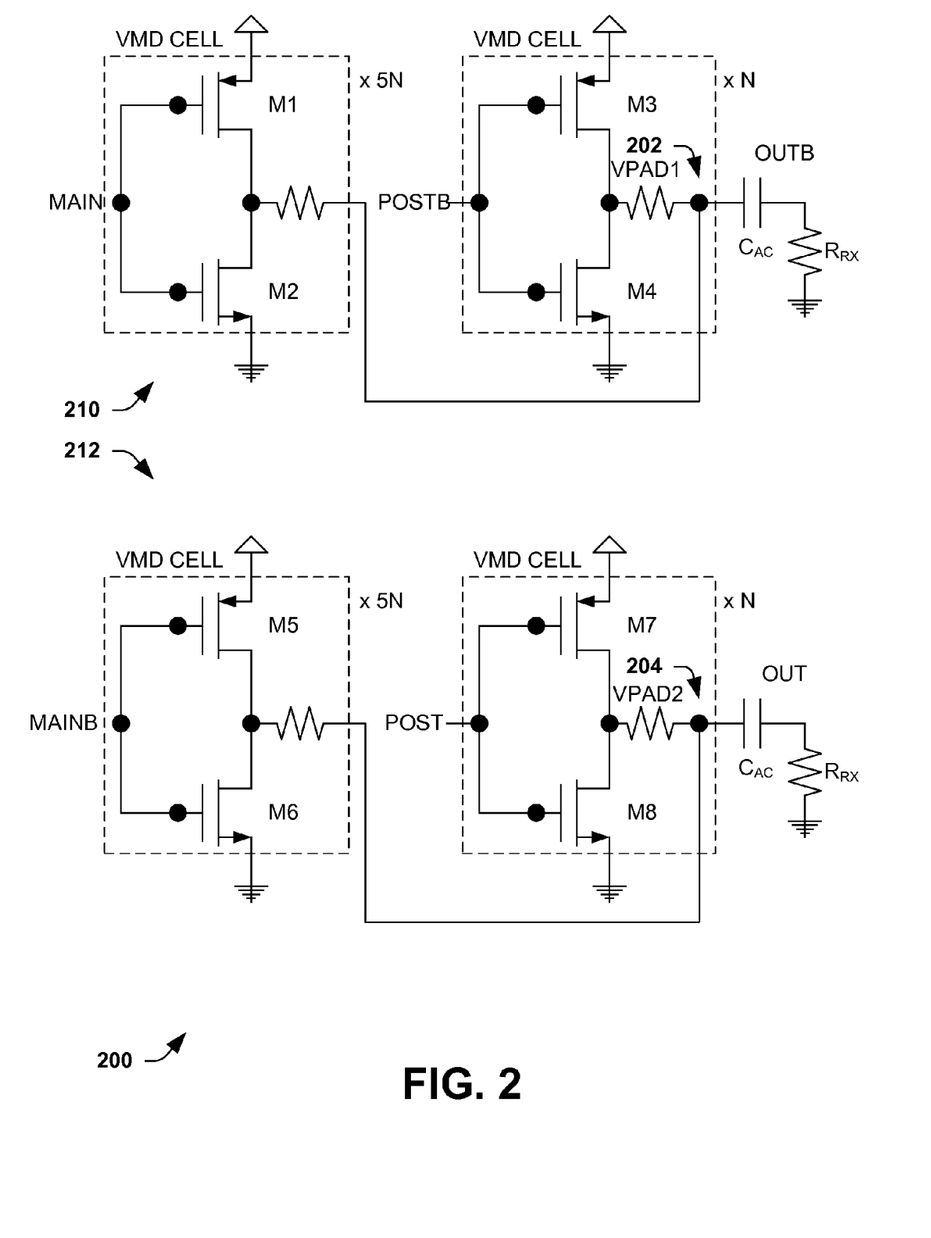
FIG. 2 is a diagram illustrating input signals and output signals for a voltage mode driver and configuring an emphasis level.

FIG. 2 is a diagram illustrating example VMD cells 200. The VMD cells 200 generally include an upper or pull up transistor, which is a PMOS transistor, and a lower or pull down transistor, which is an NMOS transistor. A first portion 210 includes a plurality of 5N MAIN cells and N POSTB cell(s) generate an output OUTB. A second section 212 includes a plurality of 5N MAINB cells and N POST cells generate an output OUT. The cells 200 also include connection points or terminals VPAD1 202 and VPAD2 204. The MAIN and MAINB cells are also referred to as main tap cells and the POST and POSTB cells are also referred to as post cursor tap cells.

In this example, The MAIN cells are comprised of series connected transistors M1 and M2. M1 is a PMOS transistor and M2 is an NMOS transistor as shown. The POSTB cell is comprised of series connected transistors M3 and M4. The MAINB cells are comprised of series connected transistors M5 and M6. The POST cell is comprised of series connected transistors M7 and M8.

In this example, with N=1 and every VMD cell having a resistance of 300 ohms, a total output impedance is 50 ohms. Receiver termination resistance $R_{RX}$ is used to sink the output signals OUT and OUTB to ground. With the total output impedance at 50 ohms, the termination resistance is set to 50 ohms. This is done when VPAD (202 and 204)=VDD*¾ for pull up resistance and VPAD=VDD*¼ for pull down resistance. As described above, the termination resistance can vary.

The cells 200, in this example, can obtain a 3.5 dB de-emphasis level by building 5N VMD cells in a main tap and N VMD cells in a post cursor tap. The de-emphasis level is given by:

$$\text{de-emphasis level} = 20 \log\left(\frac{5N+N}{5N-N}\right) = 3.5 \text{ dB}$$

Auxiliary cells are operated in a similar manner, but are calibrated for de-emphasis levels instead of full swing levels.

Figure 3A:
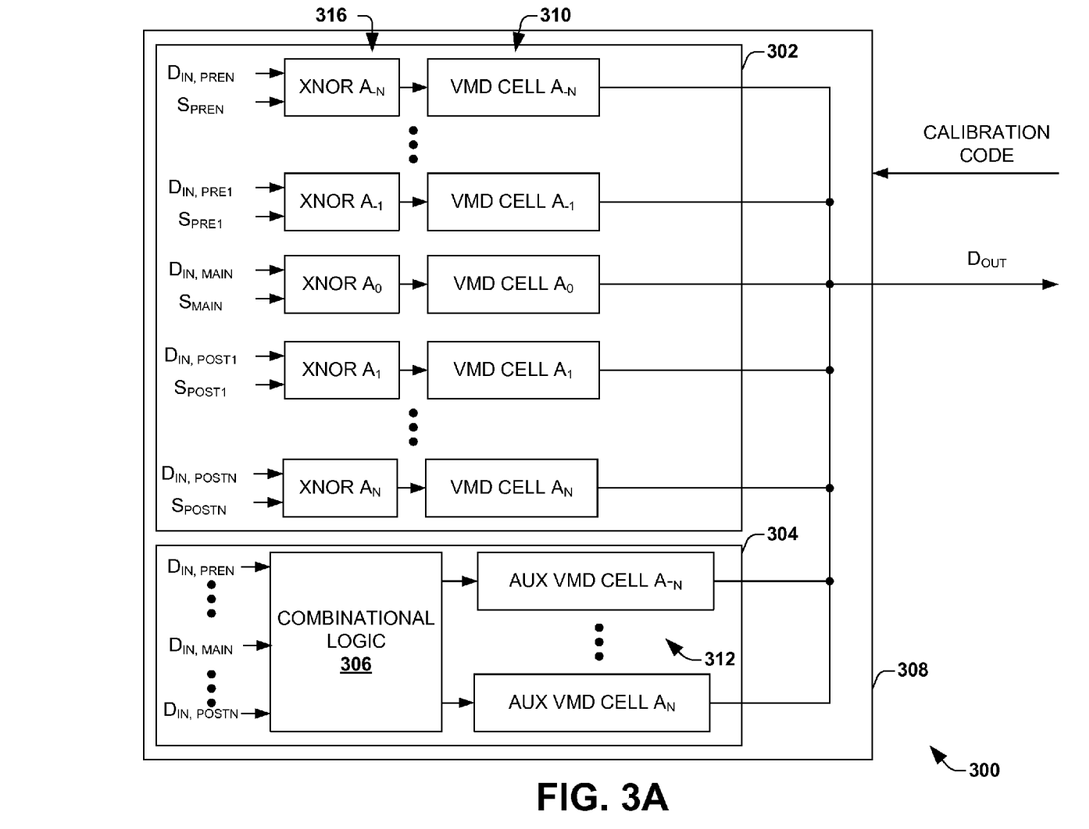
FIG. 3A is a diagram illustrating a first portion of the voltage mode driver system incorporating auxiliary driver cells.
Figure 3B:
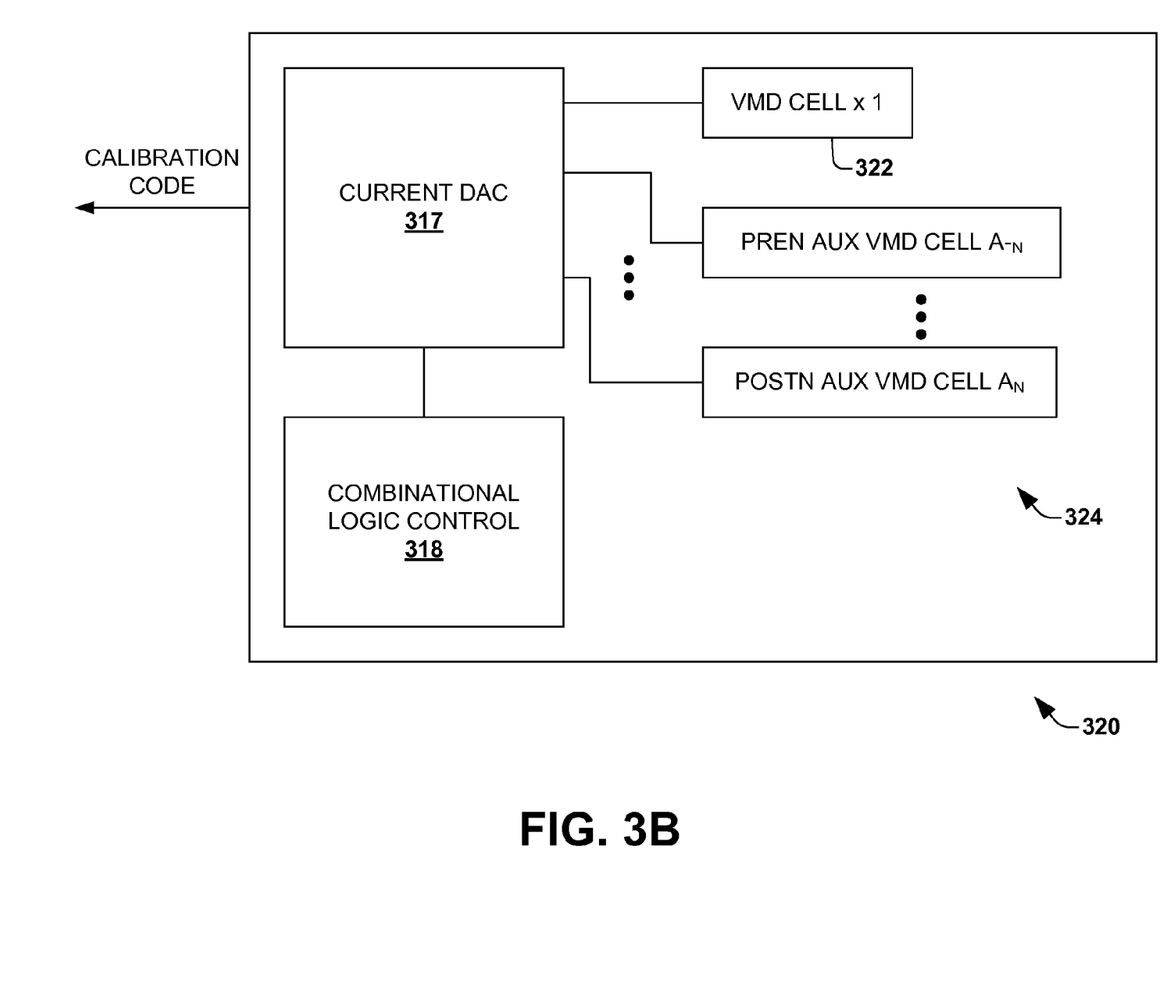
FIG. 3B is a diagram illustrating a second portion of the voltage mode driver system incorporating auxiliary driver cells.

FIGS. 3A and 3B depict a more detailed voltage mode driver system 300 incorporating auxiliary driver cells. The system 300 is described with some specific components in order to aid understanding. However, it is appreciated that variations in the disclosed components are permitted.

FIG. 3A is a diagram illustrating a first portion of the voltage mode driver system 300 incorporating auxiliary driver cells. The first portion includes a cell combination component 308, which includes a main component 302 and an auxiliary component 304.

The cell component 308 receives inputs including tap inputs and polarity inputs. In response, the cell component 308 provides an output level or signal, designated as $D_{OUT}$ in FIG. 3A. The tap inputs include a main tap input, a pre-cursor tap input, and a post cursor tap input. The pre-cursor tap inputs include one or more inputs ranging from 1 to N, designated as $D_{IN,PRE1}$ to $D_{IN,PREN}$, where N is an integer. The main tap input is a single input designated as $D_{IN,MAIN}$. The post-cursor tap inputs include one or more inputs ranging from 1 to the N, designated as $D_{IN,POST1}$ to $D_{IN,POSTN}$.

The polarity inputs use a similar designation. The polarity inputs include a main polarity input, a pre-cursor polarity input, and a post cursor polarity input. The pre-cursor polarity inputs include one or more inputs ranging from 1 to N, designated as $S_{PRE1}$ to $S_{PREN}$, where N is an integer. The main polarity input is a single input designated as $S_{MAIN}$. The post-cursor polarity inputs include one or more inputs ranging from 1 to the N, designated as $S_{POST1}$ to $S_{POSTN}$.

The polarity inputs serve to alter the polarity of a corresponding tap input. Thus, reversing the impact of the tap input. For example, if $D_{IN,PRE1}$ is set to "1", an $S_{PRE1}$ value of "0" changes the polarity and, for this example, the value input to a VMD cell to a logical "0". An $S_{PRE1}$ value of "1" permits the value of $D_{IN,PRE1}$ to be provided as is to the VMD cell.

The output level or signal provided by the cell component is a combination of outputs from the main component 302 and the auxiliary component 304. The output level or signal can be utilized for communication systems and the like.

The main component 302 includes XNOR components 316 and VMD cells 310. There are XNOR 316 and VMD cells 310 corresponding to each of the tap inputs. The XNOR 316 and VMD cells 310 range from –N to N, where N is the same integer value used for the input signals. The XNOR components 316 and VMD cells 310 are designated ranging from $A_N$ to $A_{-N}$, where $A_N$ corresponds to $D_{IN,PREN}$, $A_{-N}$ corresponds to $D_{IN,POSTN}$, and $A_0$ corresponds to $D_{IN,MAIN}$.

The XNOR components 316 are connected to the VMD cells 310. Each XNOR component receives a tap input and a polarity input and performs and XNOR or exclusive NOR logical operation on the inputs to generate its output. In one example, the tap input is provided at the XNOR output if the polarity input is set to "1" and the complement of the tap input is provided at the output if the polarity input is set to "0".

Each cell of the VMD cells 310 is connected to and receives the XNOR output from the corresponding XNOR component. Each cell generates an output according to the received XNOR output. As stated above, the output of the VMD cells 310 is incorporated into the driver output signal DOUT.

The VMD cells 310 are calibrated using a VMD calibration code portion of a calibration code. The calibration code also includes an auxiliary calibration code. The calibration code is used to alter or adjust an effective resistance of the cells 310 and 312 at pull up and pull down by controlling effective pull up resistance and pull down resistance. The VMD calibration code can be utilized to configure the VMD cells 310. In one example, the VMD calibration code is utilized to adjust turned on resistance of MOS within the VMD cells 310 and to account for transistor variations for full swing levels.

The auxiliary component 308 includes combinational logic 306 and auxiliary cells 312. The combinational logic 306 receives tap inputs including the main tap input, the pre-cursor tap inputs, and the post cursor tap inputs. The combinational logic 306 generates a plurality of auxiliary cell control signals based on the tap inputs and selected de-emphasis levels. The auxiliary cells 312 operate according to the auxiliary cell control signals.

The auxiliary cells 312 are designated as ranging from $A_N$ to $A_{-N}$, where $A_N$ corresponds to $D_{IN,PREN}$, $A_{-N}$ corresponds to $D_{IN,POSTN}$, and $A_0$ corresponds to $D_{IN,MAIN}$. The auxiliary cells 312 operate similar to the VMD cells 310. The outputs of the auxiliary cells 312 are combined into an auxiliary cell signal. The outputs of the VMD cells 310 are combined into a collective VMD cell signal. The auxiliary cell signal is added or combined with the VMD cell signal and provided as a driver output signal $D_{OUT}$.

The auxiliary cells 312 are calibrated according to auxiliary calibration code. The auxiliary calibration code is part of the calibration code received by the component 308. In one example, the auxiliary calibration code is utilized to adjust a turned on resistance to yield selected de-emphasis levels.

FIG. 3B is a diagram illustrating a second portion of the voltage mode driver system 300 incorporating auxiliary driver cells. The second portion includes a calibration component 320. The calibration component 320 is configured to generate calibration code, which includes VMD calibration code for the VMD cells 312 and auxiliary calibration code for the auxiliary cells 314.

The calibration component 320 includes a current DAC 317, logic control 318, a VMD calibration cell 322, and one or more auxiliary calibration cells 324. The calibration cells 322 and 324 are replicas of the VMD cells 310 and the auxiliary cells 312. The current DAC 317 is controlled by the logic control 318. The DAC 317 determines or measures output resistance values for the VMD cells 310 and the auxiliary cells 312 using the calibration cells 322 and 324.

The calibration cells 322 and 324 have a selected termination resistance value. In one example, the termination resistance is 50 ohm, which is also common for wireline applications. The DAC 317 generates calibration code so that the VMD cells 310 and the auxiliary cells 312 have or are near having the selected termination resistance. For example, the VMD cells 310 may be calibrated by the VMD calibration code to yield:

$$50 \times \Sigma_{M=-N}^{N} A_M \text{ ohms}$$

Where M ranges from −N to N. The VMD calibration code alters the termination resistance for $D_{OUT}$ for the full swing levels.

Similarly, the auxiliary calibration code may be generated to also yield a termination resistance of $$50 \times \Sigma_{M=-N}^{N} A_M \text{ ohms}$$

However, auxiliary calibration code impacts that termination resistance of $D_{OUT}$ for selected de-emphasis levels, instead of full swing levels.

Figure 4A:
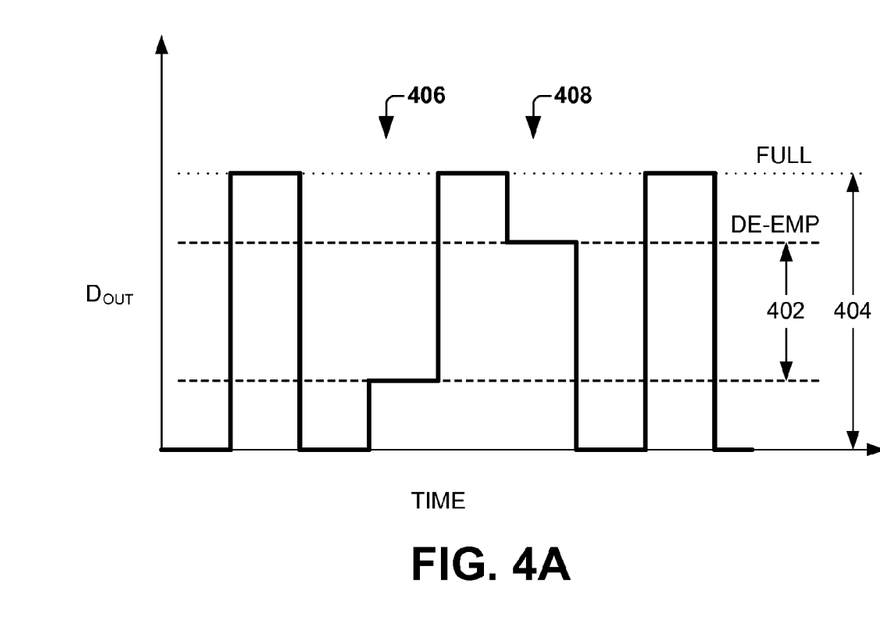
FIG. 4A is a timing diagram illustrating an example of a voltage mode driver system output signal.
Figure 4B:
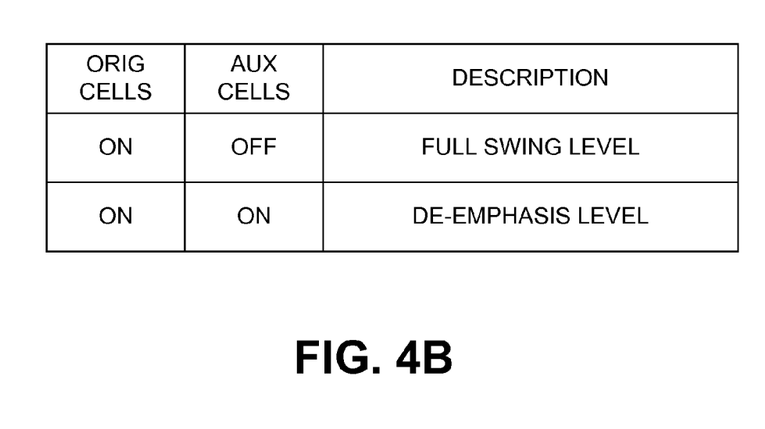
FIG. 4B is a table illustrating various control values for a voltage mode driver system.

FIGS. 4A and 4B depict an example output according to which cells of the VMD cells and the auxiliary cells are selected as ON or OFF. FIG. 4A shows the timing diagram and FIG. 4B shows a table of control signals.

FIG. 4A is a timing diagram illustrating an example of a voltage mode driver system output signal. The output signal, designated as $D_{OUT}$, can be output from the system 300, the system 100, and/or variations thereof.

An x-axis depicts time from 0 and a y-axis depicts a voltage of the output signal. Upper and lower de-emphasis levels are indicated by 402. Upper and lower full swing levels are indicated at 404. Thus, full swing levels 404 are generated as shown. At 406, a lower de-emphasis level is provided. At 408, an upper de-emphasis level is generated.

FIG. 4B is a table illustrating various control values for a voltage mode driver system. The control values configure generation of full swing levels and/or de-emphasis levels by the voltage mode driver system.

The table includes a column for original or VMD cells, a column for auxiliary cells, and a column indicating an output for the voltage mode driver system. When the original or VMD cells are set to ON, an output signal is generated. When the auxiliary cells are set to OFF, a full swing level is generated for the output signal $D_{OUT}$. When the auxiliary cells are set to ON, a de-emphasis level is generated for the output signal $D_{OUT}$.

FIGS. 5A-5E depict an example implementation of a voltage mode driver system. The system can be derived from the systems 100, 300, and variations thereof, which are described above. The example is provided to facilitate understanding and illustrate calibration, discussed below. In this implementation $A_0$ is 5 and $A_1$ is 1. Thus, there are 5 main tap cells and 1 post-cursor tap cell. However, only one main tap cell replica for P1, P2, N1 and N2 is used for calibration and one post-cursor tap cell replica for P1, P3, N1 and N3 is used for calibration. The termination resistance will be 300 ohm for 1 cell and 50 ohm actually because the 5 main tap cells and the 1 post cursor tap cell are connected together. Polarity inputs are not utilized in this example to simplify and facilitate understanding.

Figure 5A:
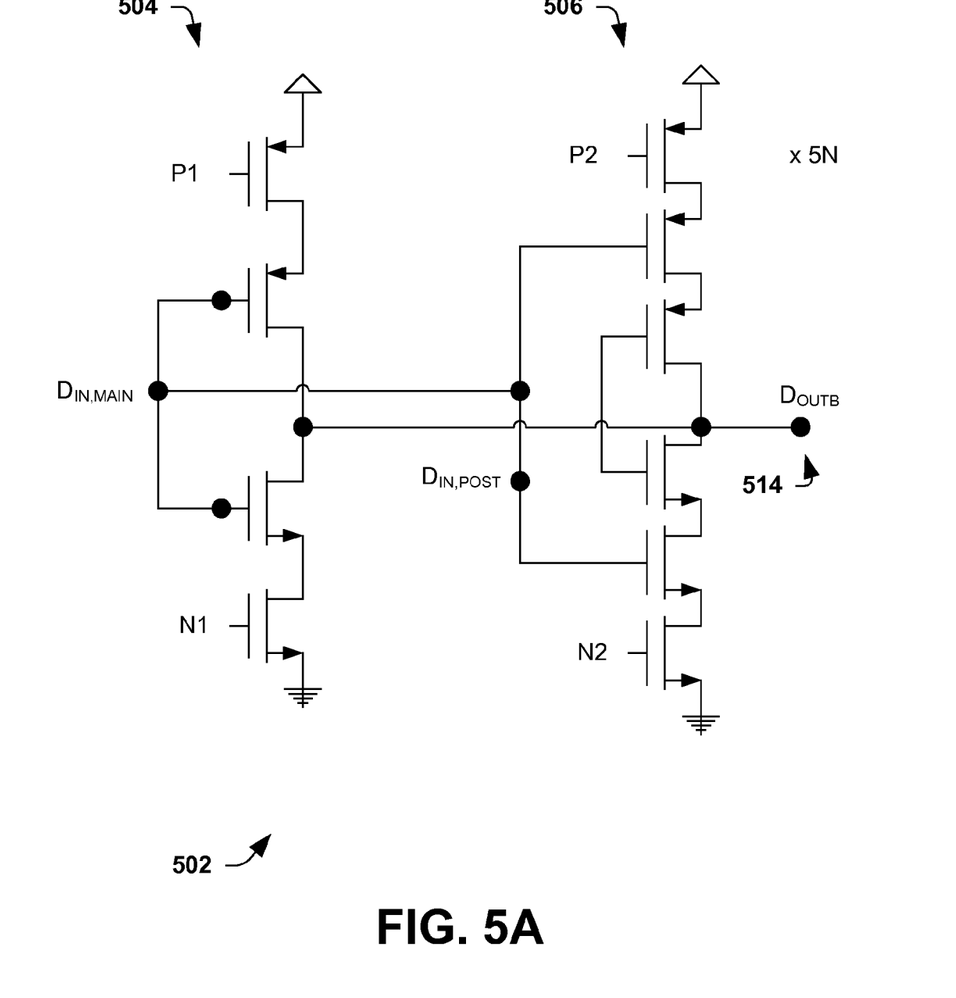
FIG. 5A is a schematic diagram of a first portion of the voltage mode driver system.

FIG. 5A is a schematic diagram of a first portion 502 of the voltage mode driver system. The first portion 502 includes an original or VMD cell 504 and an auxiliary cell 506. Only one of each is shown, however it is appreciated that the cells 504 and 506 are duplicated to yield 5 cells of each.

The VMD cell 504 receives a main tap input, $D_{IN,MAIN}$ and contributes to an output signal $D_{OUTB}$. The VMD cell 504 includes a pull up transistor P1 and a pull down transistor N1. The pull up and pull down transistors are turned ON and OFF at their gates. An output of the cell 504 is provided at node 514.

The auxiliary cell 506 receives a post cursor tap input, $D_{IN,POST}$ and the main tap input, $D_{IN,MAIN}$, and contributes to the output signal $D_{OUTB}$. The auxiliary cell 506 includes a pull up transistor P2 and a pull down transistor N2. The pull up and pull down transistors for the auxiliary cell 506 are also turned ON and OFF at their gates. An output of the cell 506 is provided at node 514. In another example, the auxiliary cell 506 receives an output from combinational logic, which receives the tap inputs, such as shown above in FIGS. 3A and 3B.

Figure 5B:
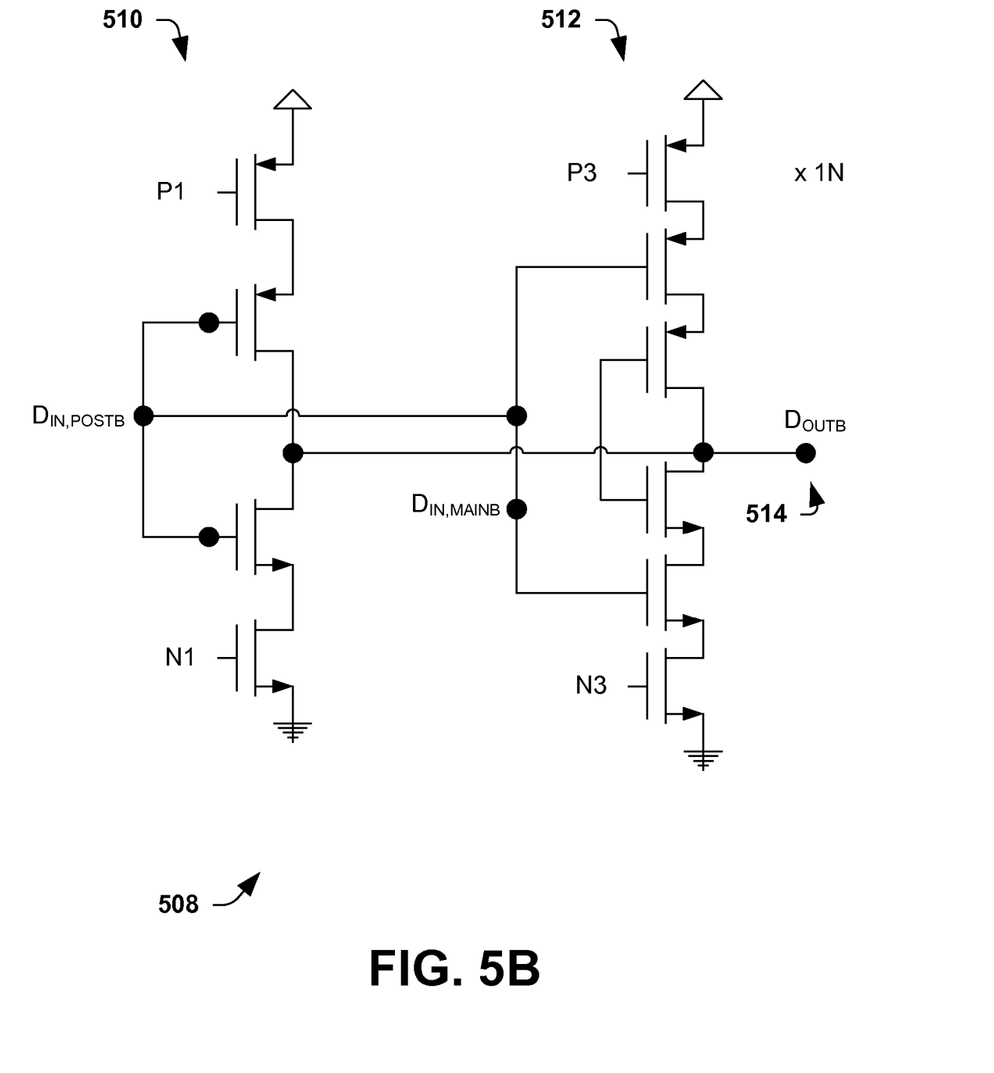
FIG. 5B is a schematic diagram of a second portion of the voltage mode driver system.

FIG. 5B is a schematic diagram of a second portion 508 of the voltage mode driver system. The second portion 508 includes an original or VMD cell 510 and an auxiliary cell 512. There is only one of each in this example as N=1.

The VMD cell 510 receives a post cursor input, $D_{IN,POSTB}$ and contributes to the output signal $D_{OUTB}$. The VMD cell 510 includes a PMOS pull up transistor P1 and an NMOS pull down transistor N1. The pull up and pull down transistors are turned ON and OFF at their gates. An output of the cell 510 is provided at the node 514.

The auxiliary cell 512 receives a main tap input, $D_{IN,MAINB}$ along with the post cursor tap input, $D_{IN,POSTB}$ and also contributes to the output signal $D_{OUTB}$. The auxiliary cell 512 includes a PMOS pull up transistor P3 and an NMOS pull down transistor N3. The pull up and pull down transistors for the auxiliary cell 512 are also turned ON and OFF at their gates. An output of the cell 508 is provided at the node 514. In another example, the auxiliary cell 512 receives an output from combinational logic, which receives the tap inputs, such as shown above in FIGS. 3A and 3B.

Figure 5C:
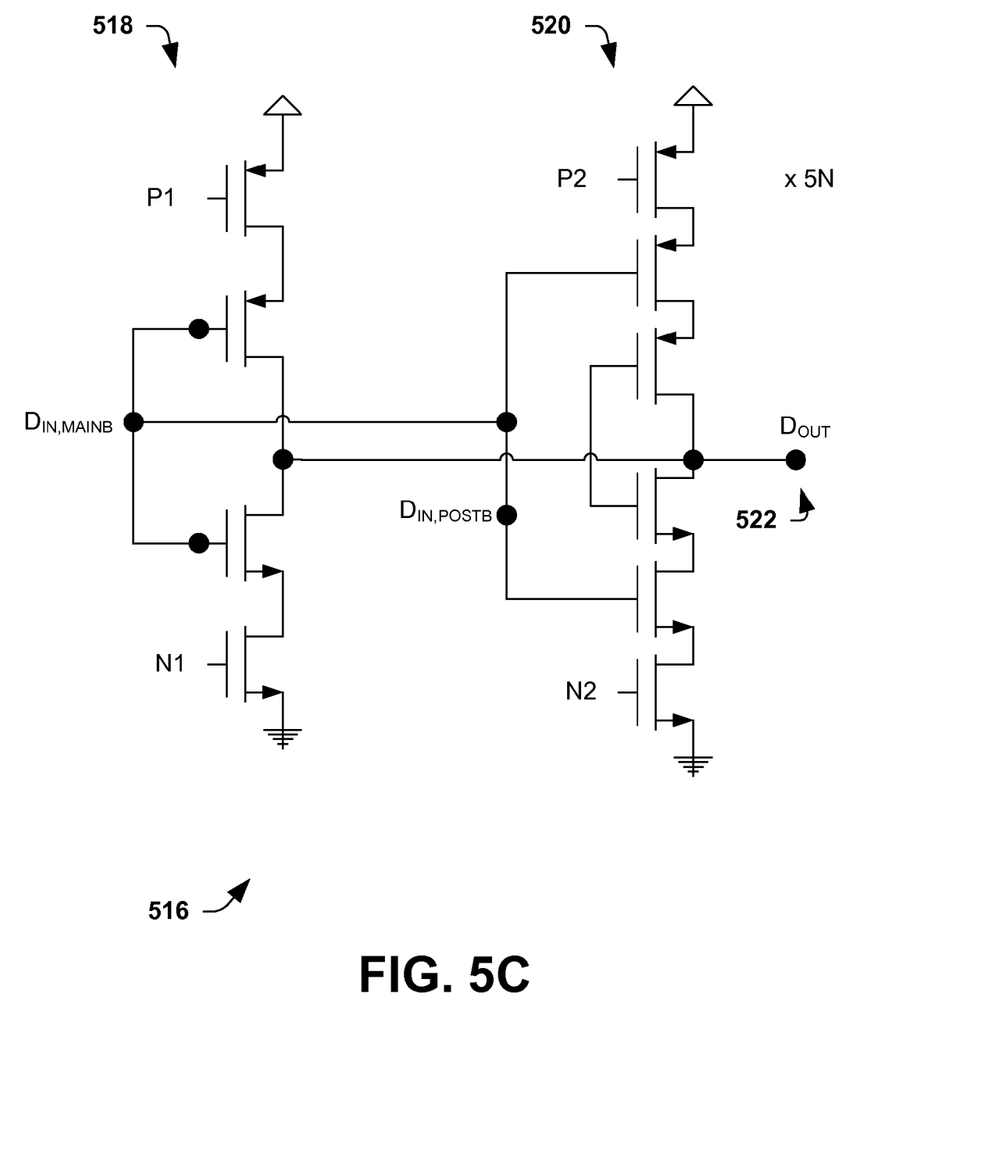
FIG. 5C is a schematic diagram of a third portion of the voltage mode driver system.

FIG. 5C is a schematic diagram of a third portion 516 of the voltage mode driver system. The third portion 512 includes an original or VMD cell 518 and an auxiliary cell 520. There are five of each in this example.

The VMD cell 518 receives a main tap input, $D_{IN,MAINB}$ and contributes to a second output signal $D_{OUT}$. The VMD cell 518 includes a PMOS pull up transistor P1 and an NMOS pull down transistor N1. The pull up and pull down transistors are turned ON and OFF at their gates. An output of the cell 518 is provided at a node 522.

The auxiliary cell 520 receives a post cursor tap input, $D_{IN,POSTB}$ along with the main tap input, $D_{IN,MAINB}$ and also contributes to the second output signal $D_{OUT}$. The auxiliary cell 520 similarly includes a PMOS pull up transistor P2 and an NMOS pull down transistor N2. The pull up and pull down transistors for the auxiliary cell 520 are turned ON and OFF at their gates. An output of the cell 520 is provided at the node 522. In another example, the auxiliary cell 520 receives an output from combinational logic, which receives the tap inputs, such as shown above in FIGS. 3A and 3B.

Figure 5D:
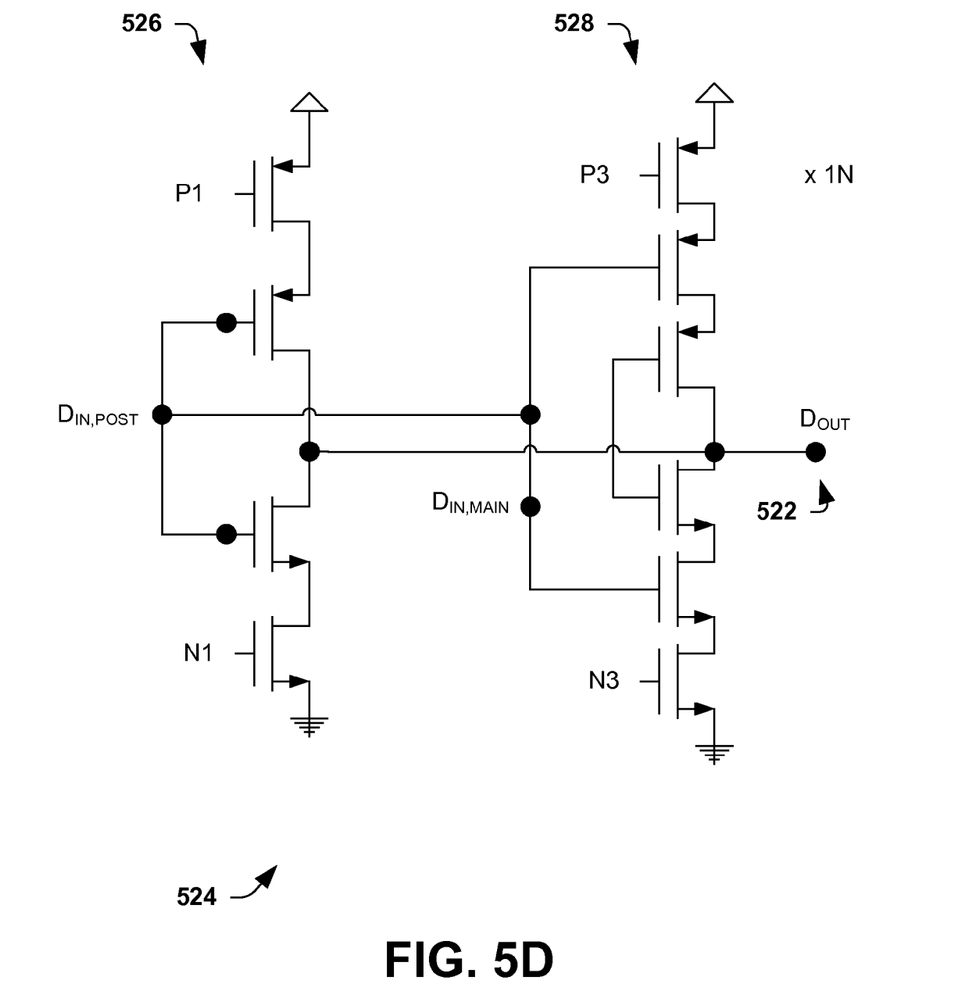
FIG. 5D is a schematic diagram of a fourth portion of the voltage mode driver system.

FIG. 5D is a schematic diagram of a fourth portion 524 of the voltage mode driver system. The fourth portion 524 includes an original or VMD cell 526 and an auxiliary cell 528. There are one of each in this example as N=1.

The VMD cell 526 receives a post cursor tap input, $D_{IN,POSTB}$ and contributes to the second output signal $D_{OUT}$. The VMD cell 526 includes a PMOS pull up transistor P1 and an NMOS pull down transistor N1. The pull up and pull down transistors are turned ON and OFF at their gates. An output of the cell 526 is provided at the node 522.

The auxiliary cell 528 receives a main tap input, $D_{IN,MAIN}$ along with the post cursor tap input, $D_{IN,POSTB}$ and also contributes to the second output signal $D_{OUT}$. The auxiliary cell 528 includes a PMOS pull up transistor P3 and an NMOS pull down transistor N3. The pull up and pull down transistors for the auxiliary cell 528 are turned ON and OFF at their gates. An output of the cell 528 is provided at the node 522. In another example, the auxiliary cell 528 receives an output from combinational logic, which receives the tap inputs, such as shown above in FIGS. 3A and 3B.

Figure 5E:
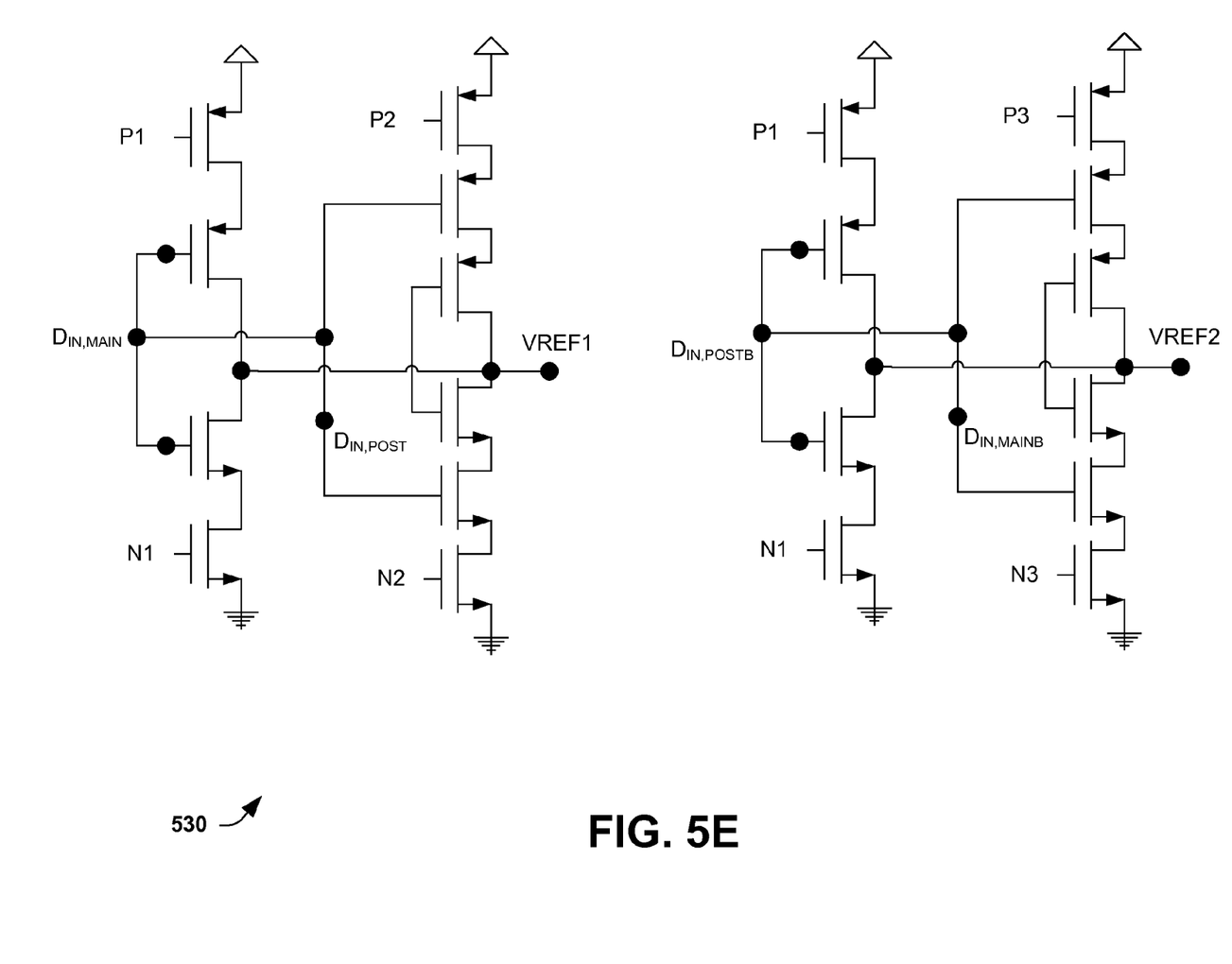
FIG. 5E is an overall view of the voltage mode driver system for calibration.

FIG. 5E is an overall view 530 of the voltage mode driver system for calibration. This view 530 shows a replica utilized for calibration purposes. Additionally, the locations for the reference voltages $V_{REF1}$ and $V_{REF2}$ are shown.

Collectively referring to FIGS. 5A to 5E, the VMD cells 504, 510, 518, and 526 operate according to control signals matching the transistors, that being P1 and N1. The auxiliary cells receiving main tap inputs 512 and 528 operate according to control signals matching their transistors, that being P3 and N3. The auxiliary cells receiving post cursor tap inputs 506 and 520 operate according to control signals matching their transistors, that being P2 and N2.

A cell is turned OFF by setting both of its pull up and pull down transistors to OFF. Thus, turning the auxiliary cells to off yields a full swing level, such as shown in FIG. 4A. The terminal resistance of VMD cells can be calibrated by setting the auxiliary cells to off and pulling up the cells by turning P1 ON. Then, the terminal resistance of the VMD cells can be calibrated for a lower full swing level by pulling the cells down by turning P1 OFF and turning N1 ON.

The terminal resistances for the cells are calibrated for the de-emphasis levels by the pull up and pull down transistors ON and/or OFF. The transistors N1, N3, P1 and P2 only are selectively turned ON for full swing and upper de-emphasis levels calibration. Further, the pull up and pull down transistors, N1, N2, P1, and P3 are selectively turned ON for lower full swing and de-emphasis levels calibration.

Continuing the above example in more detail, calibrating the terminal resistance for upper full swing and de-emphasis levels, such as shown in FIG. 4A, are described. First, calibrating for pull up transistors P1, P2 and P3 or the upper full swing level and the de-emphasis level is described. All the NMOS transistors are turned OFF, P1 is set to ON, and P2 and P3 are set to OFF. Then VPAD (VREF1 or VREF2), which corresponds to the output nodes 514 and 522 are biased to a fraction of a supply voltage (VDD).

$$VPAD = VDD * 3/4$$

The effective terminal resistance is adjusted so that the output resistance is equal to a selected terminal resistance, which in this example is 300 ohm.

Calibrating for an upper de-emphasis level for the first portion 502 and the second portion 516 is described next. The NMOS transistors are turned OFF, P1 and P2 are set to ON, and P3 is set to OFF. The VPAD ($V_{REF1}$) is set to a lower fraction of the supply voltage (VDD).

$$VPAD = VDD * 2/3$$

The effective terminal resistance is adjusted for P2 is adjusted so that the total output resistance is equal to the selected terminal resistance, 300 ohm in this example.

Calibrating for a lower de-emphasis level for the second portion 508 and the fourth portion 524 is described next. The NMOS transistors are turned OFF, P1 and P3 are set to ON, and P2 is set to OFF. The VPAD ($V_{REF2}$) is set to a second lower fraction of the supply voltage (VDD).

$$VPAD = VDD * 1/3$$

The effective terminal resistance is adjusted for P3 so that the total output resistance is equal to the selected terminal resistance, 300 ohm in this example.

Calibrating for lower full swing and de-emphasis levels is described next. All the PMOS transistors are turned OFF, N1 is set to ON, and N2 and N3 are set to OFF. Then VPAD (VREF1 or VREF2), which corresponds to the output nodes 514 and 522 are biased to a fraction of a supply voltage (VDD).

$$VPAD = VDD * 1/4$$

The effective terminal resistance in N1 is adjusted so that the output resistance is equal to a selected terminal resistance, which in this example is 300 ohm.

Calibrating for a lower de-emphasis level for the first portion 502 and the second portion 516 is described next. The PMOS transistors are turned OFF, N1 and N2 are set to ON, and N3 is set to OFF. The VPAD (VREF1) is set to a fraction of the supply voltage (VDD).

$$VPAD = VDD * 1/3$$

The effective terminal resistance is adjusted for N2 so that the total output resistance is equal to the selected terminal resistance, 300 ohm in this example.

Calibrating for an upper de-emphasis level for the second portion 508 and the fourth portion 524 is described next. The PMOS transistors are turned OFF, N1 and N3 are set to ON, and N2 is set to OFF. The VPAD (VREF2) is set to a fraction of the supply voltage (VDD).

$$VPAD = VDD * 2/3$$

The effective terminal resistance is adjusted for N3 so that the total output resistance is equal to the selected terminal resistance, 300 ohm in this example.

Figure 6:
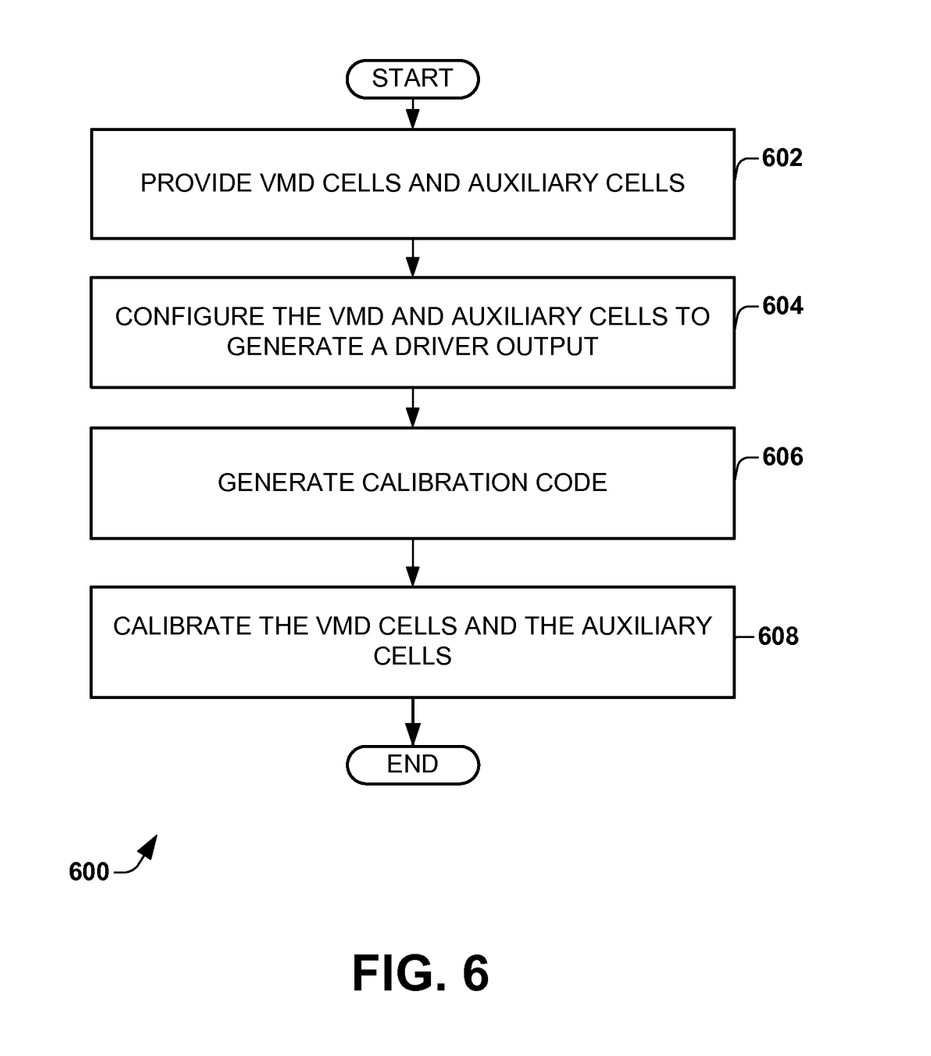
FIG. 6 is a flow diagram illustrating a method of operating a voltage mode driver.

FIG. 6 is a flow diagram illustrating a method 600 of operating a voltage mode driver. The method 600 uses a multi-level termination scheme to facilitate performance and signal integrity.

The method 600 begins at block 602 wherein VMD cells and auxiliary cells are provided. The cells may be arranged in arrays of cells and the like. In one example, the cells are arranged in arrays according to a tap input type. For example, the auxiliary cells can be divided into a main tap input array and a post cursor tap input array. The cells are configured having pull up and pull down arrangements and connect to a referenced node, referred to as a pad node, $V_{REF}$ or VPAD. A termination component can be connected to the pad node.

The VMD cells and the auxiliary cells are configured to generate a driver output at block 604. The cells may be configured according to received inputs, including tap inputs and/or polarity inputs. The tap inputs include a main tap input, pre cursor tap inputs, and post cursor tap inputs.

Calibration code is generated at block 606 according to a plurality of selected levels. The calibration code is generated by measuring output signals and comparing to selected and/or expected results. Variations can be identified and utilized to generate the calibration code. The variations include process, voltage, and temperature induced variations.

The calibration code may include code specific to the VMD or main cells, referred to as main calibration code and code specific to the auxiliary cells, referred to as auxiliary calibration code. The code is generated according to multiple selected levels including full swing levels and de-emphasis levels.

The auxiliary and the VMD cells are calibrated at block 608 according to the calibration code. The code is utilized to adjust one or more properties of the cells and to mitigate variations of actual output signals with the plurality of selected levels.

In one example, the auxiliary cells are calibrated by applying a partial supply voltage to a node of the auxiliary cells. Then, the cell current is adjusted to yield a selected terminal resistance.

It will be appreciated that while reference is made throughout this document to exemplary structures in discussing aspects of methodologies described herein (e.g., the structure presented in above figures, while discussing the methodology set forth in FIG. 6), that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

A voltage mode driver system includes a plurality of VMD cells, a plurality of auxiliary cells, a control logic and an output node. The plurality of VMD cells are configured to generate a first output. The plurality of auxiliary cells are configured to generate a second output. The output node combines the first output and the second output into a driver output. The control logic is configured to control the plurality of auxiliary cells and the second output according to a selected level.

A voltage mode driver calibration component includes a first reference cell, a plurality of auxiliary reference cells, and a combinational logic. The first reference cell has a first selected terminal resistance. The plurality of auxiliary reference cells have a second selected terminal resistance. The combinational logic is configured to compare a driver output with the first reference cell and the plurality of auxiliary reference cells to generate a calibration code.

A method of operating a voltage mode driver is disclosed. First cells and auxiliary cells are provided. The first cells may include original or VMD cells. The first cells and the auxiliary cells are configured to generate an output signal. Calibration code is generated according to the driver output and a plurality of selected levels, which may include de-emphasis levels. At least the auxiliary cells are calibrated according to the calibration code.

While a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A voltage mode driver system comprising:
a plurality of VMD cells configured to generate a first output;
a plurality of auxiliary cells configured to generate a second output;
an output node to combine the first output and the second output into a driver output;
a control logic configured to control the plurality of auxiliary cells and the second output according to a selected level; and
a calibration component coupled to the plurality of VMD cells and the plurality of auxiliary cells and configured to generate VMD calibration code for the plurality of VMD cells according to a first termination resistance and to generate auxiliary calibration code for the plurality of auxiliary cells according to a second termination resistance.

2. The system of claim 1, wherein the selected level is a de-emphasis level.

3. The system of claim 1, wherein the selected level is a full swing level.

4. The system of claim 1 wherein the calibration component is configured to provide the auxiliary calibration code to the auxiliary cells according to the selected level and a voltage dependence effect.

5. The system of claim 1, wherein the calibration component is configured to provide the auxiliary calibration code to the auxiliary cells according to a selected termination resistance at a full swing level.

6. The system of claim 1, wherein the calibration component is configured to generate the VMD calibration code according to the driver output.

7. The system of claim 6, wherein the VMD calibration code accounts for transistor variations within the plurality of VMD cells.

8. The system of claim 7, wherein the VMD calibration code is related to a full swing level.

9. The system of claim 1, wherein the plurality of VMD cells are calibrated by the VMD calibration code according to a full swing level and the plurality of auxiliary cells are calibrated by the auxiliary calibration code according to a de-emphasis level.

10. The system of claim 1, wherein the plurality of VMD cells and the plurality of auxiliary cells are configured to receive tap inputs.

11. The system of claim 10, wherein the tap inputs include main tap inputs, post cursor tap inputs, and pre cursor tap inputs.

12. The system of claim 1, further comprising XNOR components coupled to the plurality of VMD cells and the plurality of auxiliary cells, the XNOR components configured to receive tap inputs and polarity inputs.

13. A voltage mode driver calibration component comprising:
- a first reference cell having a first selected terminal resistance;
- a plurality of auxiliary reference cells having a second selected terminal resistance; and
- a combinational logic configured to compare a driver output with the first reference cell and the plurality of auxiliary reference cells to generate a calibration code, wherein the calibration code adjusts a turned on resistance for the first reference cell and the plurality of auxiliary reference cells to account for transistor variations.

14. The component of claim 13, wherein the calibration code includes a first calibration code corresponding to full swing levels and an auxiliary calibration code corresponding to de-emphasis levels.

15. The component of claim 14, wherein the first calibration code corresponds to the first selected terminal resistance.

16. The component of claim 14, wherein the auxiliary calibration code corresponds to the second selected terminal resistance.

17. The component of claim 13, wherein the first selected terminal resistance equals the second selected terminal resistance.

18. A method of operating a voltage mode driver, the method comprising:
- providing first cells and auxiliary cells;
- configuring the first cells and the auxiliary cells to generate a driver output;
- measuring the driver output to identify for variations from expected results;
- generating calibration code according to the identified variations, a selected terminal resistance, a plurality of selected levels and the driver output; and
- calibrating at least the auxiliary cells according to the calibration code.

19. The method of claim 18, wherein calibrating at least the auxiliary cells includes applying a partial supply voltage to a node of the auxiliary cells and adjusting cell current to yield the selected terminal resistance.

20. The method of claim 18, wherein configuring the first cells and the auxiliary cells includes turning a portion of the auxiliary cells on according to tap inputs.

* * * * *